US007964481B2

(12) United States Patent
Mitzi et al.

(10) Patent No.: US 7,964,481 B2
(45) Date of Patent: *Jun. 21, 2011

(54) METHOD FOR FABRICATING AN INORGANIC NANOCOMPOSITE

(75) Inventors: David B. Mitzi, Mahopac, NY (US); Christopher B. Murray, Ossining, NY (US); Dmitri V. Talapin, Richmond, CA (US)

(73) Assignee: International Business Machines Corporation, Armonk, NY (US)

( * ) Notice: Subject to any disclaimer, the term of this patent is extended or adjusted under 35 U.S.C. 154(b) by 52 days.

This patent is subject to a terminal disclaimer.

(21) Appl. No.: 12/423,516

(22) Filed: Apr. 14, 2009

(65) Prior Publication Data

US 2009/0236594 A1 Sep. 24, 2009

Related U.S. Application Data

(63) Continuation of application No. 11/330,291, filed on Jan. 12, 2006, now Pat. No. 7,517,718.

(51) Int. Cl.
*H01L 21/20* (2006.01)
(52) U.S. Cl. ........................................ 438/500
(58) Field of Classification Search .................. None
See application file for complete search history.

(56) References Cited

U.S. PATENT DOCUMENTS

| 6,379,585 | B1 | 4/2002 | Vecht et al. | |
| 6,875,661 | B2 | 4/2005 | Mitzi | |
| 7,288,468 | B2 * | 10/2007 | Jang et al. | 438/500 |
| 2004/0067355 | A1 * | 4/2004 | Yadav et al. | 428/323 |
| 2004/0103936 | A1 * | 6/2004 | Andriessen | 136/252 |
| 2005/0009229 | A1 | 1/2005 | Mitzi | |
| 2007/0020400 | A1 * | 1/2007 | Chang | 427/421.1 |

OTHER PUBLICATIONS

Zhong et al., Composition-Tunable ZnCdSe Nanocrystals with High Luminescence and Stability, Journal American Chemical Society 2003, 125, 8589-8594.
Murray et al., Synthesis and Characterization of Nearly Monodisperse CdE (E=S, Se, Te) Semiconductor Nanocrystallites, Journal American Chemical Society 1993, 115, 8706-8715.
Ho, P., et al., "All-Polymer Optoelectronic Devices," Science, vol. 285, pp. 233-236, Jul. 9, 1999.
Snaith, H., et al., "Self-Organization of Nanocrystals in Polymer Brushes. Application in Heterojunction Photovoltaic Diodes," Nano Letters, vol. 5, No. 9, pp. 1653-1657 (2005).
Mitzi, D., et al., "High-mobility ultrathin semiconducting films prepared by spin coating," Nature, vol. 428, pp. 299-303, Mar. 18, 2004.
Mitzi, D., "Solution-processed inorganic semiconductors," Journal of Materials Chemistry, vol. 14, pp. 2355-2365 (2004).

(Continued)

*Primary Examiner* — Charles D Garber
*Assistant Examiner* — Andre' C Stevenson
(74) *Attorney, Agent, or Firm* — Connolly Bove Lodge & Hutz LLP; Vazken Alexanian, Esq.

(57) ABSTRACT

An inorganic nanocomposite is prepared by obtaining a solution of a soluble hydrazine-based metal chalcogenide precursor; dispersing a nanoentity in the precursor solution; applying a solution of the precursor containing the nanoentity onto a substrate to produce a film of the precursor containing the nanoentity; and annealing the film of the precursor containing the nanoentity to produce the metal chalcogenide nanocomposite film comprising at least one metal chalcogenide and at least one molecularly-intermixed nanoentity on the substrate. The process can be used to prepare field-effect transistors and photovoltaic devices.

23 Claims, 12 Drawing Sheets

OTHER PUBLICATIONS

Mitzi D., et al., "Low-Voltage Transistor Employing a High-Mobility Spin-Coated Chalcogenide Semiconductor," Advanced Materials, vol. 17, pp. 1285-1289 (2005).

Cao, Y., et al., "Growth and Properties of Semiconductor Core/Shell Nanocrystals with InAs Cores," Journal of the American Chemical Society, vol. 122, pp. 9692-9702 (2000).

Kyratsi, T., et al., "$KSb_5S_8$: A Wide Bandgap Phase-Change Material for Ultra High Density Rewritable Information Storage," Advanced Materials, vol. 15, No. 17, pp. 1428-1431 (2003).

Kolobov, A., et al., "Understanding the phase-change mechanism of rewritable optical media," Nature Materials, vol. 3, pp. 703-708, Oct. 2004.

Kourtakis, K., et al., "Preparation and Characterization of $SnS_2$," Journal of Solid State Chemistry, vol. 76, pp. 186-191 (1988).

Berlepsch, P., et al., "The crystal structures of synthetic $KSb_5S_8$ and $(Tl_{0.598}, K_{0.402})Sb_5S_8$ and their relation to parapierrotite $(TlSb_5S_8)$," Z. Kristallogr., vol. 214, pp. 57-63 (1999).

Manna, L., et al., "Synthesis of Soluble and Processable Rod-, Arrow-, Teardrop-, and Tetrapod-Shaped CdSe Nanocrystals," Journal of the American Chemical Society, vol. 122, pp. 12700-12706 (2000).

Gangopadhyay, R., et al., "Conducting Polymer Nanocomposites: A Brief Overview," Chemical Materials, vol. 12, pp. 608-622 (2000).

* cited by examiner

Figure 1 TEM images of (a) CdSe nanocrystals and (b) CdSe nanorods.

Figure 2. TEM images of (a) Bi nanocrystals used as catalysts for solution-liquid-solid synthesis of CdSe nanowires as shown in (b). (c,d) Typical TEM images of as-synthesized CdSe nanowires.

Figure 3. Absorption spectra of CdSe nanocrystals in hexane (curve a) and in hydrazine in the presence of 25mg/mL $(N_2H_4)_2ZnTe$ (curve b).

METHOD FOR FABRICATING AN INORGANIC NANOCOMPOSITE

TECHNICAL FIELD

The present disclosure relates to fabricating an inorganic nanocomposite comprising at least one metal chalcogenide and at least one nanoentity (e.g., nanoparticle, nanorod, nanotetrapod, nanowire and the like). The present disclosure also relates to methods for preparing field-effects transistors, data storage media and photovoltaic devices comprising the inorganic nanocomposites prepared according to this disclosure.

BACKGROUND

Nanometer-scaled composites provide the opportunity to combine useful attributes of two or more materials within a single composite or to generate entirely new properties as a result of the intermixing of the two components. Many useful biological composite materials, for example, can be found in Nature, including mollusk shells, teeth and bone. For instance, see J. D. Currey, *J. Mater. Educ.*, 9, 120 (1987) and H. A. Lowenstam and S. Weiner, *On Biomineralization*, Oxford University Press, New York, 1989.

Mollusk shells, consist of highly organized laminated microstructures of aragonite $CaCO_3$ crystals (with thickness of ~250 nm) separated by a thin (30-50 nm) layer of proteinaceous organic matter. The resulting strength and toughness of this brick and mortar structure is orders of magnitude higher than those for either of the constituents alone. The useful properties of this biological composite arise from the highly organized and appropriately proportioned combination of a hard brittle inorganic phase with a soft plastic organic phase, with strong interfacial bonding between the two components.

A second example, this time of a synthetic nanocomposite, can be found in polyimide chemistry. Polyimides are used for microelectronic applications because of their heat resistance, chemical stability, and superior electrical properties. In an effort to reduce the coefficient of thermal expansion and the amount of moisture absorption, a small amount of clay (montmorillonite) is dispersed on a molecular level in the polymer. Only about 2 weight percent addition of montmorillonite lowers the permeability coefficients for various gases to less than one-half of the values for pure polyimide, while at the same time reducing the thermal expansivity. For example, see K. Yano, A. Usuki, A. Okada, T. Kurauchi, O. Kamigaito, *J. Polym. Sci.: Part A: Polym. Chem.*, 31, 2493 (1993).

These and other related molecularly-dispersed polymer/layered silicate nanocomposites have been shown to achieve a higher degree of stiffness, strength, heat and flame resistance, and barrier properties, with far less inorganic content than comparable glass (or mineral) reinforced "filled" polymers as a result of the molecular scale interaction between the two components.

Another example of a nanometer-scaled composite is a nanocomposite of nanoparticles and conjugated polymers, designed to achieve composition-tunable optical constants for use in semiconducting photonic structures. The 550-nm wavelength in-plane refractive index of poly(p-phenylenevinylene)-silica composites can, for example, be tailored over the range of 1.6 to 2.7 using this approach, allowing the fabrication of efficient distributed Bragg reflectors and waveguides. See, for instance, P. K. H. Ho, D. S. Thomas, R. H. Friend, N. Tessler, *Science*, 285, 233 (1999).

Inorganic nanoparticles dispersed in conducting polymers have also been formed into nanocomposites with potentially useful colloidal stability, optical, dielectric, magnetic susceptibility, electrochromic and catalytic properties. For example, see R. Gangopadhyay, A. De, *Chem. Mater.*, 12, 608 (2000). H. J. Snaith, G. L. Whiting, B. Sun, N. C. Greenham, W. T. S. Huck, R. H. Friend, *NanoLett.*, 5, 1653 (2005).

While the above examples are predominantly organic-inorganic nanocomposites, strictly inorganic nanocomposites are also expected to be of high utility. As for the organic-inorganic hybrids, useful properties can be expected as a result of the nanometer scale integration. Strictly inorganic nanocomposite are expected to be particularly desirable compared to organic-inorganic hybrids because of the improved thermal and mechanical stability of the composite, as well as the potential for much better electrical transport characteristics (e.g., carrier mobility).

In addition to obtaining inorganic nanocomposites with useful properties, it is desirable to be able to process the nanocomposites into useable forms using relatively low-cost and high throughput fabrication techniques. For electronic applications, thin films are commonly the targeted form and solution-based techniques such as spin coating, stamping, drop casting, doctor blading or printing are all ideal examples of potentially low-cost high-throughput processes. Unfortunately, most bulk inorganic semiconductors of interest are not soluble in common solvents. Recently, however, inventors of the present application have demonstrated a solution-processing technique for the deposition of high-mobility metal chalcogenide films using hydrazine or hydrazine/water mixtures as the solvent. For example, see U.S. Pat. No. 6,875,661, Mitzi et al. *Nature*, 428, 299 (2004) and Mitzi, *J. Mater. Chem.*, 14, 2355 (2004).

The process involves forming soluble hydrazine-based precursors of targeted metal chalcogenide semiconductors (typically $SnS_{2-x}Se_x$), spin coating films of the precursors, and thermally decomposing the precursor films at low temperature to form the desired continuous metal chalcogenide films. Additionally, n-type indium(III) selenide films have been spin-coated, using the corresponding hydrazinium precursor and mixed ethanolamine/DMSO solvents. See Mitzi et al., *Adv. Mater.*, 17, 1285 (2005).

Thin-film field-effect transistors (TFTs) have been constructed, based on the solution-deposited semiconducting chalcogenides, yielding n-type channels with electron mobilities in excess of 10 $cm^2$/V-s, approximately an order of magnitude better than previous results for spin-coated semiconductors.

Nanoparticles and other nanoentities also provide an exceptional degree of electronic and structural flexibility, primarily exemplified by the ability to continuously tailor the size of the particles and therefore, via quantum confinement effects, the electronic properties of the particles. The electronic and boundary properties of the particles can also be controlled by employing a core-shell approach for fabricating the nanoparticle wherein the core of the nanoparticle is a different material than the outer shell. See Cao et al., *J. Am. Chem. Soc.*, 122, 9692 (2000). Additionally, nanoentities of different shape can be fabricated, ranging from spheres, to rods, wires and tetrapods. See Manna et al. *J. Am. Chem. Soc.*, 122, 12700 (2000). Typical tetrapod-shaped nanocrystals contain at least four arms. The shape includes a nuclei with arms growing out of each of the four (111) equivalent faces. In some configurations, arms of the tetrapod have branches growing in the vicinity of their ends. Different functionalization of the nanoparticles can affect the dispersability of the nanoparticles in solvents and provides another degree of flexibility.

SUMMARY OF DISCLOSURE

This disclosure describes a process of distributing nanoentities (nanorods, nanowires, nanoparticles, nano-tetrapods) in hydrazine-based precursor solutions during solution processing of films.

In particular, the process of the present disclosure comprises obtaining a solution of a soluble hydrazine-based metal chalcogenide precursor; dispersing a nanoentity in the said solution of the metal chalcogenide precursor; applying a solution of the precursor containing the nanoentity (a nanoentity is an inorganic chemical object with at least one dimension between approximately 0.5-100 nm) onto a substrate to produce a film of said precursor containing the nanoentity; and annealing the film of the precursor containing the nanoentity to produce the metal chalcogenide nanocomposite film comprising at least one metal chalcogenide and at least one nanometer-scale-intermixed nanoentity on the substrate.

The present disclosure also relates to films produced by the above disclosed process.

The present disclosure still further provides methods of preparing a solution-processed semiconducting composite film of metal chalcogenide and nanoentity that have the advantage of being low cost.

Useful properties can be expected as a result of the nanometer scale integration of inorganic components. Several useful examples of inorganic nanocomposites include: 1) An intimate network of n- and p-type semiconductors (with appropriate choice of band gaps and offsets). The resulting array of distributed p-n junctions would be useful for solar cell and photodetector technology. In this example, it would be most useful to have a nanocomposite in which both n- and p-type components form a continuous network throughout the material. 2) A nanocomposite comprised of discrete semiconducting islands might be useful for charge storage arrays for memory devices. 3) Desirable phonon scattering, resulting from the periodic grain boundaries in an appropriately-tailored inorganic nanocomposite, may provide outstanding thermoelectric characteristics. In each of these examples, a strictly inorganic nanocomposite might be desirable compared to an organic-inorganic hybrid because of the improved thermal and mechanical stability of the composite, as well as the potential for much better electrical transport characteristics (e.g., carrier mobility). The metal chalcogenide and nanoentity composites produced according to the present disclosure can be used in a variety of applications, including photovoltaic devices and solar cells, flat panel displays, non-linear optical/photo-conductive devices, chemical sensors, emitting and charge transporting layers in light-emitting diodes, thin-film transistors, channel layers in field-effect transistors, photodetectors and media for optical and electronic data storage, including phase change media for optical and electronic data storage.

Accordingly, the present disclosure also relates to a method of preparing a field-effect transistor having a source region and a drain region, a channel layer including a semiconducting material, a gate region disposed in spaced adjacency to the channel region, an electrically insulating layer between the gate region and the source region, drain region and channel layer wherein the channel comprises a semiconducting film of a metal chalcogenide and nanoentity composite; and wherein the method comprises depositing the film of the metal chalcogenide and nanoentity composite by obtaining a solution of a soluble hydrazine-based metal chalcogenide precursor; dispersing a nanoentity in the said solution of a precursor of the metal chalcogenide; applying a solution of the precursor containing the nanoentity onto a substrate to produce a film of said precursor containing the nanoentity; and annealing the film of the precursor containing the nanoentity to produce the metal chalcogenide nanocomposite film comprising at least one metal chalcogenide and at least one molecularly-intermixed nanoentity on the substrate.

The present disclosure also relates to field-effect transistors obtained by the above method.

Still other objects and advantages of the present disclosure will become readily apparent by those skilled in the art from the following detailed description, wherein it is shown and described only the preferred embodiments, simply by way of illustration of the best mode. As will be realized, the disclosure is capable of other and different embodiments, and its several details are capable of modifications in various obvious respects, without departing from the disclosure. Accordingly, the description is to be regarded as illustrative in nature and not as restrictive.

Figure 7:
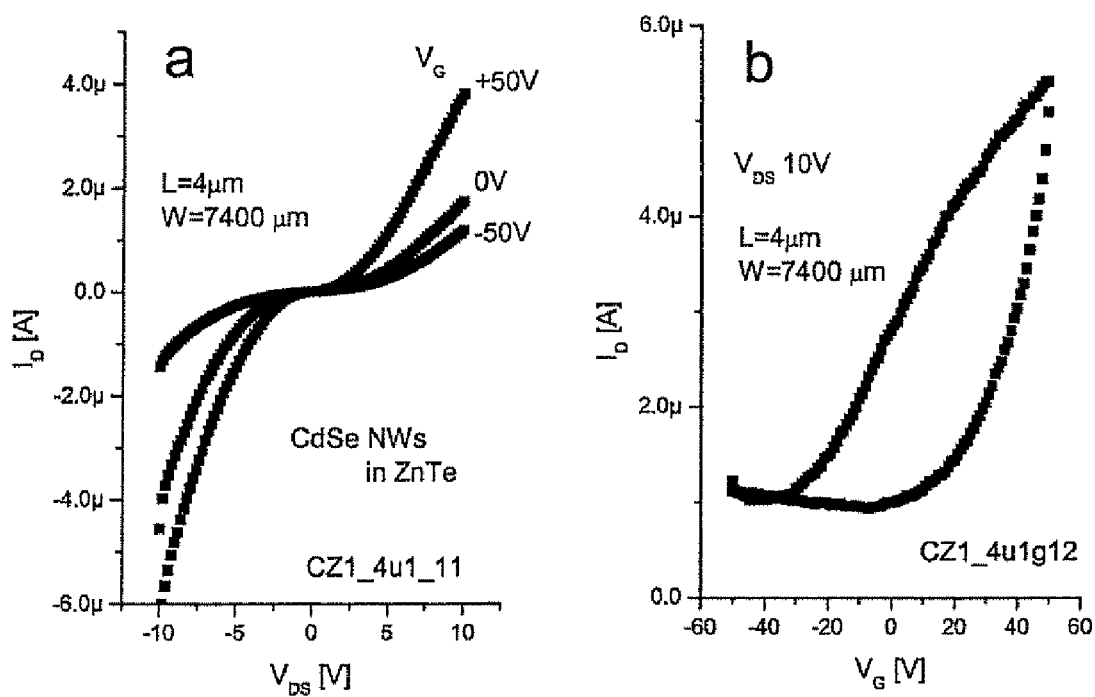
FIG. 7a is a graph of drain current $I_d$ vs. source-drain voltage $V_{ds}$ at different gate voltages $V_G$ for a device with a channel comprised of CdSe nanowires in a ZnTe matrix (CdSe: ZnTe~1:10 by weight).
FIG. 7b is a graph showing dependence of the drain current $I_d$ on the gate voltage $V_G$ at $V_{DS}$=10V for a device with a channel comprised of CdSe nanowires in a ZnTe matrix (CdSe: ZnTe~1:10 by weight).

For FIGS. 7a and 7b channel length L=4 μm, width W=7400 μm. The film is spin-coated at 1000 rpm onto a Si substrate with 100 nm thick $SiO_2$ gate dielectric layer and annealed at 250° C. for 20 min. Bottom source and drain electrodes Ti/Au.

Figure 8:
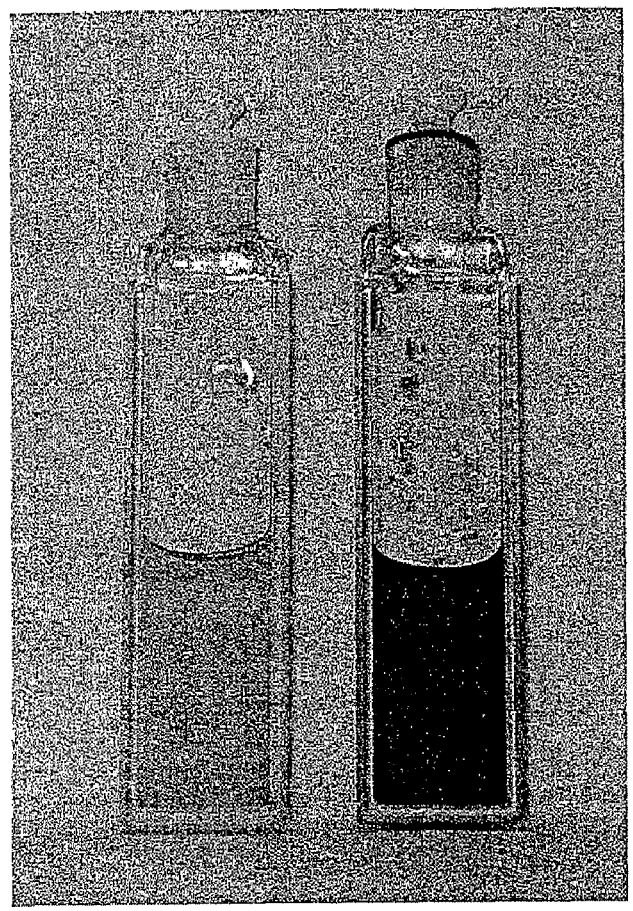

FIG. 8 is a photograph of solutions of CdSe nanocrystals in hydrazine in the presence of 0.05M $(N_2H_5)_2(N_2H_4)_2In_2Se_4$. The size of CdSe nanocrystals is ~3 nm (left cuvette) and ~5.2 nm (right cuvette).

Figure 9:
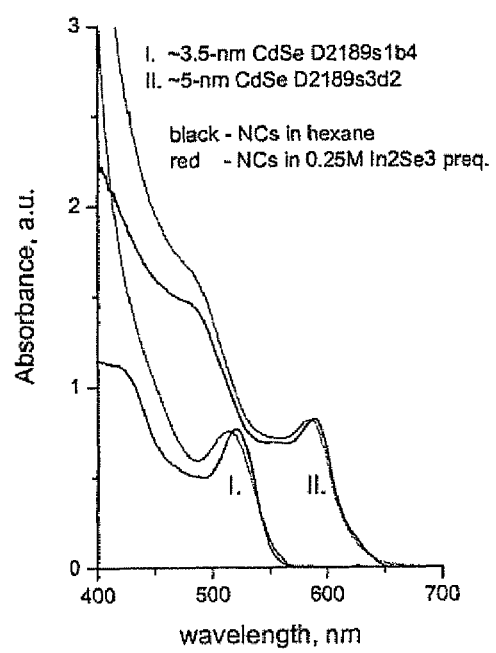

FIG. 9 shows absorption spectra of CdSe nanocrystals dispersed in hexane (curves a) and in hydrazine in the presence of 0.05M $(N_2H_5)_2(N_2H_4)_2In_2Se_4$ (curves b).

Figure 10:
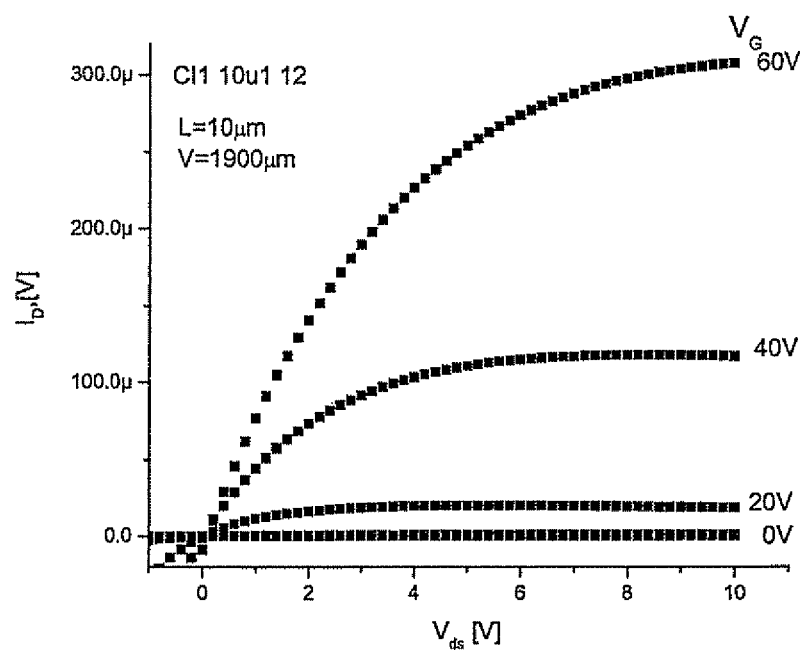

FIG. 10 shows transistor characteristics (drain current $I_d$ vs. source-drain voltage $V_{ds}$ at different gate voltages $V_G$) for a device with a channel comprised of 5 nm CdSe nanocrystals in $In_2Se_3$ matrix (CdSe: $In_2Se_3$~1:5 by weight). The channel length and width are L=10 μm and W=1900 μm, respectively. The film is spin-coated at 1000 rpm and annealed at 350° C. for 20 min. The gate dielectric is 100 nm thick $SiO_2$.

Figure 11:
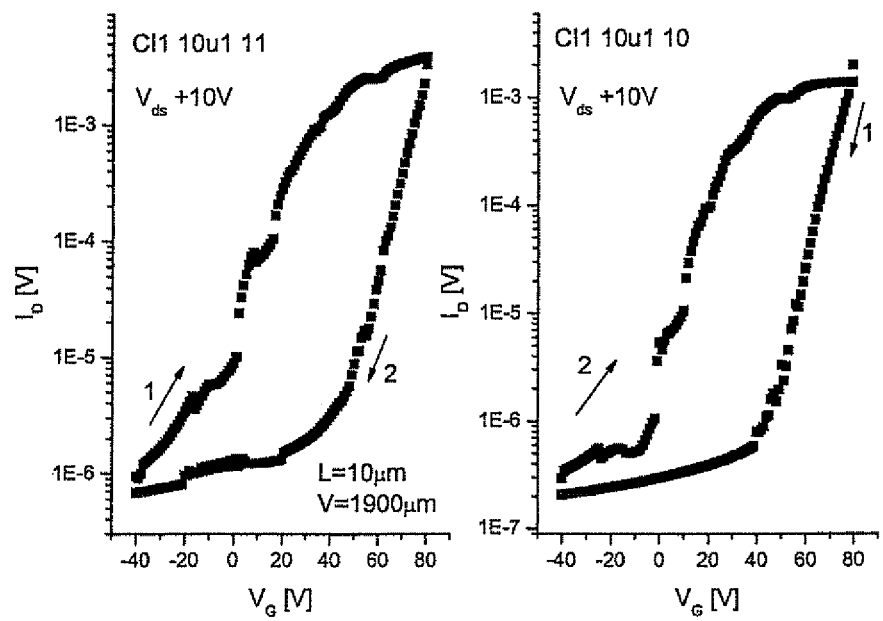

FIG. 11 shows dependence of drain current $I_d$ on the gate voltage $V_G$ at source-drain bias $V_{DS}$=10 V for a device with a channel comprised of 5 nm CdSe nanocrystals in an $In_2Se_3$ matrix (CdSe:$In_2Se_3$~1:5 by weight). Channel length L=10 μm, width W=1900 μm. The film is spin-coated at 1000 rpm and annealed at 350° C. for 20 min. The gate dielectric is 100 nm thick $SiO_2$.

Figure 12:
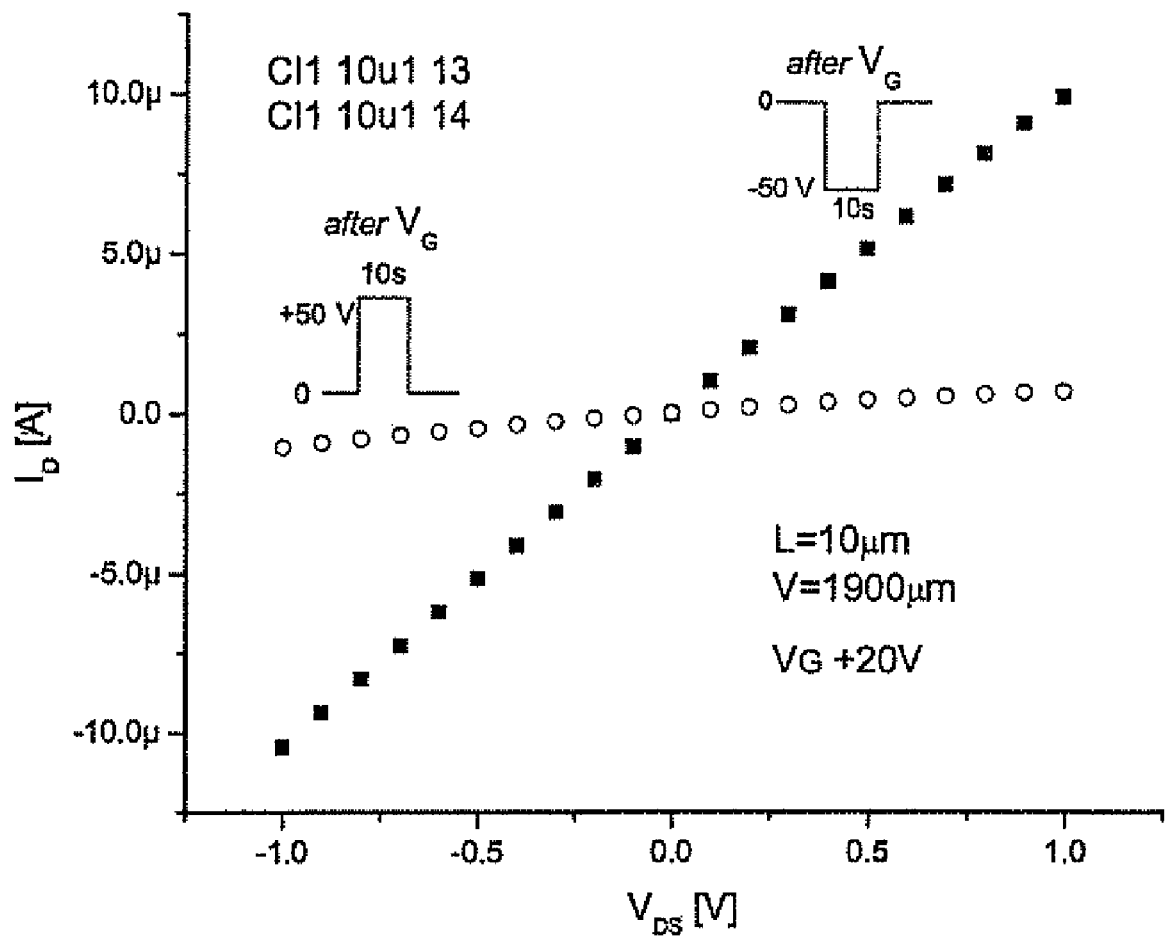

FIG. 12 shows a memory effect in a nanocomposite film made of 5 nm CdSe nanocrystals in an $In_2Se_3$ matrix (CdSe: $In_2Se_3$~1:5 by weight). Drain current $I_d$ vs. source-drain voltage $V_{ds}$ at $V_G$=20V measured 2 min after applying +50 V (open circles) or −50 V (solid squares) bias to the back gate electrode for 10 s. L=10 μm, W=1900 μm. The film is spin-coated at 1000 rpm and annealed at 350° C. for 20 min. The gate dielectric is 100 nm thick $SiO_2$.

Figure 13:
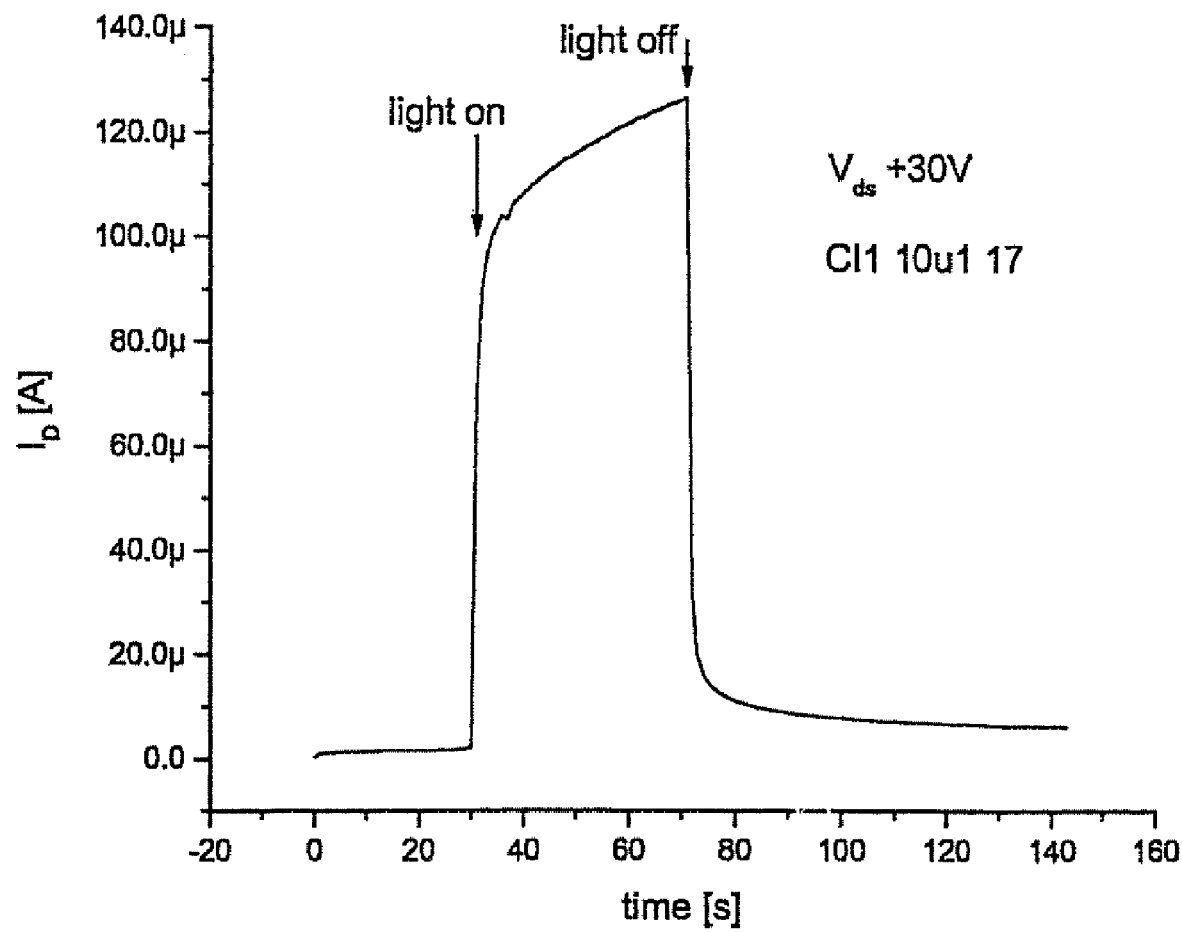

FIG. 13 shows photocurrent generated in the nanocomposite film made of 5 nm CdSe nanocrystals in a $In_2Se_3$ matrix (CdSe: $In_2Se_3$ ~1:5 by weight) under illumination with broad band light source. L=10 μm, W=1900 μm. This experiment employed a two-terminal device with a floating gate, $V_{ds}$=30 V. The film is spin-coated at 1000 rpm and annealed at 350° C. for 20 min. Ti/Au bottom electrodes are employed.

FIGS. 14*a* and 14*b* show typical TEM (a) and HRTEM (b) images of PbSe nanowires capped with n-tetradecylphosphonic and oleic acids.

Figure 15:
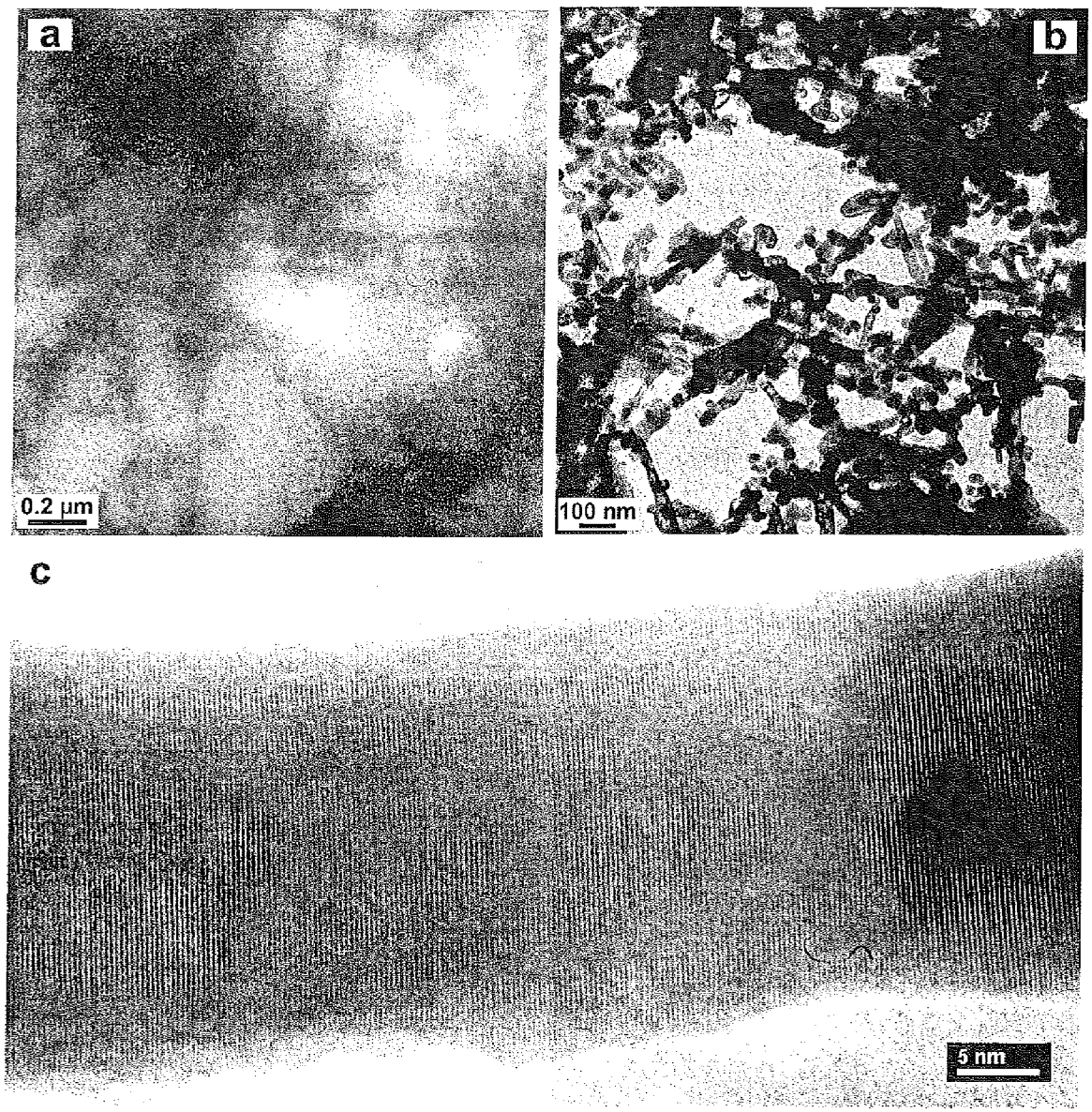

FIGS. 15*a*, *b* and *c* show TEM images of nanocomposites formed from PbSe nanowires and $(N_2H_4)_2ZnTe$ (a) before and (b) after annealing at 250° C. for 20 min in nitrogen, and (c) high resolution TEM image of a fragment of PbSe nanowire-ZnTe nanocomposite material.

BEST AND VARIOUS MODES

The present disclosure relates to a method for fabricating an inorganic nanocomposite.

The method comprises obtaining a solution of a soluble hydrazine-based metal chalcogenide precursor. The solution of the soluble hydrazine-based metal chalcogenide precursor can be prepared by dissolving a soluble hydrazine-based metal chalcogenide precursor in a solvent, with optionally an excess of chalcogen, to provide a solution of the metal chalcogenide precursor. It is understood, of course, that mixtures of metal chalcogenide precursors may be used, if desired, in the formation of the solution of the metal chalcogenide precursor. Additionally, the solution of a metal chalcogenide precursor may be formed by directly dissolving a metal chalcogenide, with optionally an excess of chalcogen, in hydrazine (i.e., without first isolating the hydrazine-based metal chalcogenide precursor).

The hydrazine-based precursor may be isolated by any of the techniques described in U.S. Pat. No. 6,875,661; U.S. patent application Ser. No. 10/801,766, filed Mar. 16, 2004 and Ser. No. 11/055,976 filed Feb. 14, 2005 or in Mitzi et al., *Nature*, 428, 299 (2004) and Mitzi et al. *Adv. Mater.* 17, 1285 (2005). In U.S. Pat. No. 6,875,661 and U.S. patent application Ser. No. 10/801,766, for example, a process was described in which the targeted metal chalcogenide semiconductor (more preferably, a main-group metal chalcogenide) is dissolved in hydrazine or a mixture of solvents containing hydrazine, preferably in the presence of excess chalcogen (e.g., S or Se) to improve solubility. The resulting solution can be evaporated to yield a hydrazinium-based precursor, which may be soluble in a variety of solvents including a hydrazine compound or mixtures of a hydrazine compound with other solvents. Additionally, in some cases, the precursor is soluble in selected amine-based solvents (such as mixtures of ethanolamine and DMSO). Suitable examples of solvents include, but are not limited to: hydrazine, ethanolamine, n-butylamine, n-propylamine, diethanolamine, alcohols, water, DMF, DMSO and mixtures thereof.

The hydrazine-based precursor may either be an ionic solid comprised of metal chalcogenide anions and hydrazinium cations or a more covalent compound comprised of an extended metal chalcogenide framework with covalently-bonded hydrazine molecules. Examples of ionic precursors include $(N_2H_5)_4Sn_2S_6$, $(N_2H_4)_3(N_2H_5)_4Sn_2Se_6$ and $(N_2H_5)_4Ge_2Se_6$, which each consist of dimers of edge-sharing $MX_4^{4-}$ (M=Sn or Ge; X=S or Se) tetrahedra, separated by hydrazinium cations. An example of a covalent precursor is $(N_2H_4)_2ZnTe$. The precursor solution is formed by dissolving the precursor in an appropriate solvent as listed above.

Examples of hydrazine compounds can be represented by the formula:

wherein each of $R^1$, $R^2$, $R^3$ and $R^4$ is independently hydrogen, aryl such as phenyl, a linear or branched alkyl having 1-6 carbon atoms such as methyl, ethyl or a cyclic alkyl of 3-6 carbon atoms; More typically, in this method, each of $R^1$, $R^2$, $R^3$ and $R^4$ is independently hydrogen, aryl, methyl or ethyl. Even more typically, the hydrazine compound is hydrazine, i.e., where $R^1$, $R^2$, $R^3$ and $R^4$ are all hydrogens.

In addition to the metal chalcogenide precursor or precursors, the nanoentities must also be obtained or fabricated. For example, the nanoentity, such as nanoparticles, nanorods and nanowires, with desired dimensions and optionally a core-shell configuration, can be prepared by various methods. For instance, nanoparticles are generally synthesized by methods such as colloidal synthesis, vapor-liquid-solid and related growth techniques, sonochemical synthesis, synthesis in reverse micelles, laser pyrolysis and arc discharge. To date, colloidal synthesis allows obtaining nanoparticles of different materials with the most precise control over particle size, shape, and monodispersity. The size of the particles is controlled by choice of surfactants (stabilizing ligands), precursors, and reaction conditions (solvent, concentrations of precursors and stabilizing agents, temperature, etc.). The shape of the particles is controlled by tailoring growth kinetics of different facets of crystalline nanoparticles. This can be achieved by selective adhesion of organic molecules to a particular crystal facet or by growth with elimination of high-energy facets [e.g., Y. Yin, A. P. Alivisatos, Nature 2005, 437, 664-670]. Core-shell configuration is allowed by sequential growth via adding reagents (precursors) of the shell material to the colloidal solution containing nanoparticles of the core materials. Different surface functionalization provides to the nanoparticles solubility in desired polar or non-polar solvents and can introduce specific affinity to certain types of surfaces or organic and biomolecules.

The nanoentites are then dispersed in the hydrazine-based precursor solution. This can be accomplished by simply adding the nanoentities to the precursor solution and stirring for an amount of time just sufficient to put the nanoentities into solution. Typically the stirring process is carried out at room temperature.

The hydrazine-based precursor solution containing the nanoentity is applied to a substrate.

Typically, the substrate is fabricated from a material having at least one property selected from the following: thermally stable, i.e., stable up to about at least 300° C.; chemically inert towards the metal chalcogenides; rigid or flexible. Suitable examples include Kapton, silicon, amorphous hydrogenated silicon, silicon carbide (SiC), silicon dioxide ($SiO_2$), quartz, sapphire, glass, metal, diamond-like carbon, hydrogenated diamond-like carbon, gallium nitride, gallium arsenide, germanium, silicon-germanium, indium tin oxide, boron carbide, boron nitride, silicon nitride ($Si_3N_4$), alumina ($Al_2O_3$), cerium (IV) oxide ($CeO_2$), tin oxide ($SnO_2$), titania ($TiO_2$), $Ta_2O_5$, $ZrO_2$, $HfO_2$, zinc titanate ($ZnTiO_2$), lead zirconate titanate (PZT), a plastic material or a combination thereof. More typically, the metal substrate is a metal foil, such as, aluminum foil, tin foil, stainless steel foil and gold foil, and the plastic material more typically is polycarbonate, Mylar or Kevlar.

Using high-throughput techniques such as spin-coating, stamping, drop casting, or printing, solutions are applied to the substrate and transformed into thin films of the precursor containing the nanoentity. The substrates can be heated by placing on a hot plate, or in a box or tube furnace under an appropriate inert atmosphere such as nitrogen, forming gas or argon. Alternatively, the heating may take place by laser-based annealing. Heating is performed at a temperature high enough and for a time long enough to enable complete decomposition of the hydrazine-based precursor but low enough and for short enough time not to induce significant diffusion among the components. Typically the heating is carried out at a temperature of about 100 to about 350° C. and for an amount of time from about 1 to about 60 min.

The process of the present disclosure provides a number of advantages. For instance, dispersing the nanoentities in an inorganic matrix provides the potential of much better electrical characteristics of the matrix with respect to comparable organic matrices (such as conducting polymers). In particular, the electrical mobility of the carriers (electrons and/or holes) can be orders of magnitude higher in a crystalline inorganic matrix compared with an organic matrix. In addition, the thermal stability of the composite can be much better than for an organic-inorganic nanocomposite because of the better thermal stability of the inorganic matrix.

The inorganic nanocomposite has exceptional tunability. The inorganic matrix that is derived from the hydrazine-based precursor can be selected from among an array of chalcogenide metals, semiconductors and insulators. Suitable examples include, but are not limited to: $GeS$, $GeSe_2$, $SnS_2$, $SnSe_2$, $Sb_2S_3$, $Sb_2Se_3$, $Sb_2Te_3$, $In_2Se_3$, $In_2Te_3$, $Cu_2S$, $HgSe$, $ZnTe$ and mixtures thereof. The chalcogenide matrix may either exhibit n-type or p-type electrical behavior. With regard to the nanoentity component, the nanoentity may be of various size (to influence energy levels through quantum confinement effects), shape (e.g., spheres, rods, wires, tetrapods), surface functionalization (to influence the ease with which the nanoentities go into solution), material (for example, CdS, CdSe, CdTe, PbS, PbSe, PbTe, ZnS, ZnSe, $Bi_2S_3$, $Bi_2Se_3$, $Bi_2Te_3$, HgS, HgSe, HgTe, InP, InAs, Co, Fe, FePt, and core/shell CdSe/ZnS, CdSe/CdS, InP/CdSe, InP/ZnS, InP/ZnSe, InAs/CdSe, InAs/ZnSe and combinations thereof). By choosing nanoparticles (spheres) or nanorods versus nanowires and by selecting the concentration of the nanoentity in the inorganic matrix material, it is possible to influence whether the nanoentities form an extended network or an array of isolated nanoentities in the final nanocomposite.

The process allows for potentially low-cost, very high-throughput deposition of inorganic nanocomposites, without the requirement of vacuum conditions or specialized CVD reactors. The solution-processing technique is also a relatively low-temperature process and is compatible with selected higher-temperature flexible plastic substrate materials, such as Kapton and other polyimide-based plastics.

The processes described herein are useful in forming semiconductor films for applications including, for example, thin-film transistors (TFTs), light-emitting devices (LED's), data storage media, photovoltaic devices and solar cell devices.

The present disclosure provides a thin film field-effect transistor (FET) having a film of a nanocomposite material, based on a solution-processed metal chalcogenide material containing a nanoentity, as the active semiconducting layer. The present disclosure provides a method of preparing an improved field-effect transistor of the type having a source region and the drain region, the channel layer including a semiconducting material, a gate region disposed in spaced adjacency to the channel layer, an electrically insulating layer between the gate region and the source region, drain region and channel layer, wherein the method includes:

preparing a channel layer including a film of a solution-processed metal chalcogenide semiconducting material containing a nanoentity by the method disclosed above.

Figure 4:
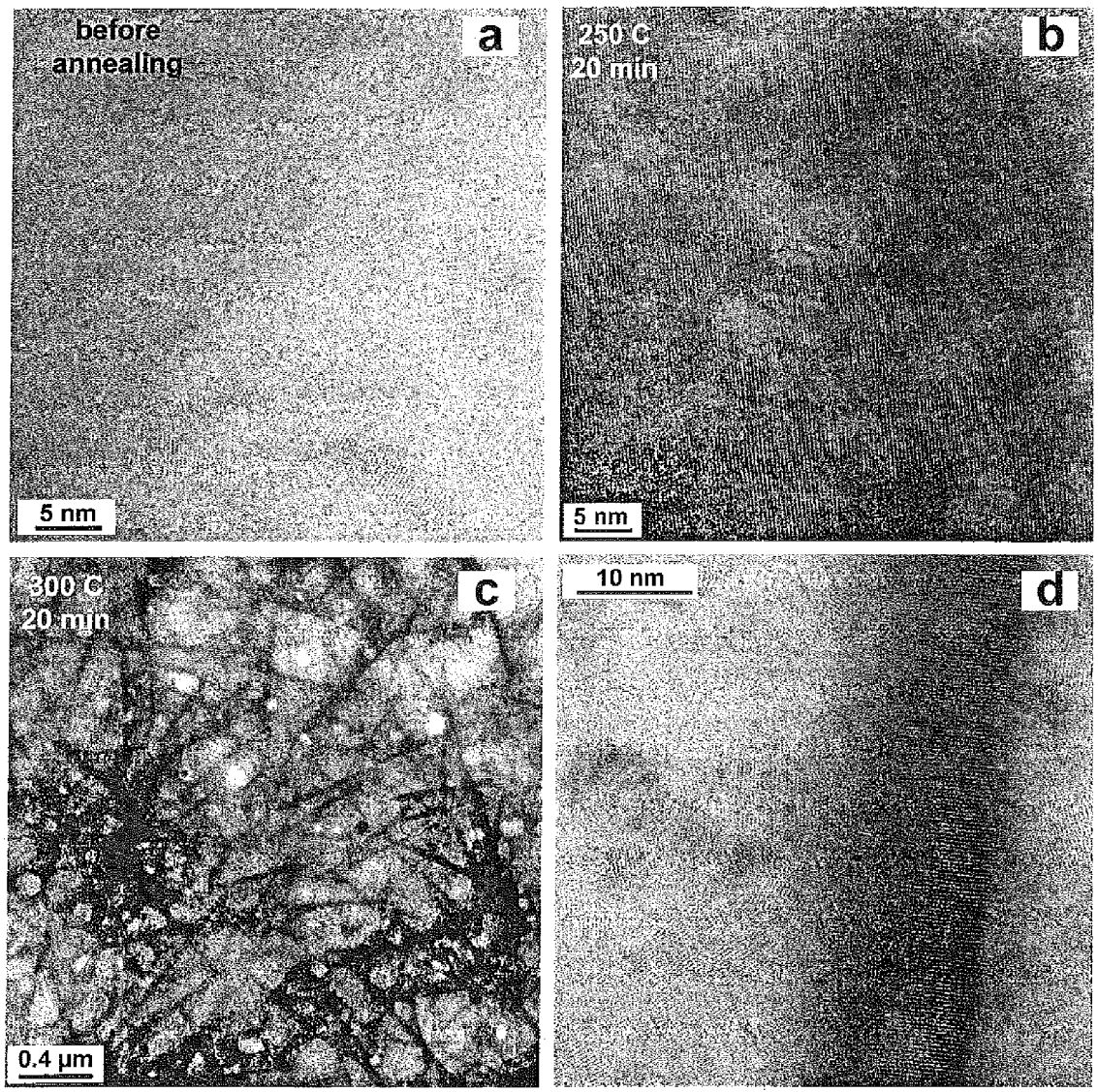
FIG. 4a shows a high-resolution TEM image of a nanocomposite prepared from CdSe nanorods and $(N_2H_4)_2ZnTe$ before annealing.
FIG. 4b shows TEM images of nanocomposites prepared from CdSe nanorods and $(N_2H_4)_2ZnTe$ after annealing at 250° C. for 20 min in nitrogen.
FIG. 4c shows a TEM image of a film of CdSe nanowires in ZnTe matrix after annealing at 300° C. for 20 min in nitrogen.
FIG. 4d shows a HRTEM image showing the interface between CdSe nanowire and ZnTe matrix.

In one embodiment, the source region, channel layer and drain region are typically disposed upon a surface of a substrate, the electrically insulating layer is disposed over the channel layer and extending from the source region to the drain region, and the gate region is disposed over the electrically insulating layer, for example, as shown in FIG. 4 of the U.S. Pat. No. 6,180,956, the disclosure of which is incorporated herein by reference.

Figure 3:
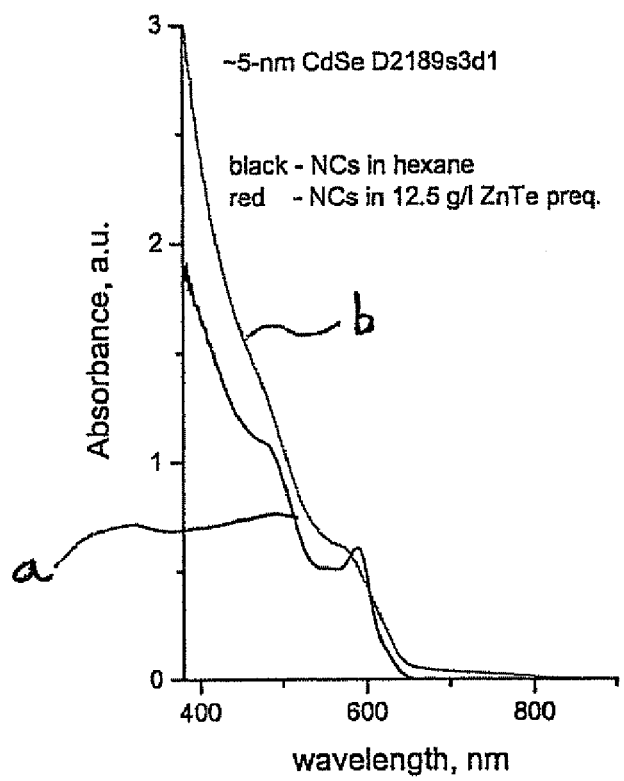
FIG. 3 shows absorption spectra of CdSe nanocrystals dispersed in hexane (curve a) and in hydrazine in the presence of 25 mg/mL $(N_2H_4)_2ZnTe$ (curve b).

In another embodiment, the gate region is disposed as a gate layer upon a surface of a substrate, the electrically insulating layer is disposed upon the gate layer, and the source region, channel layer, and drain region are disposed upon the electrically insulating layer, for example, as shown in FIG. 3 of the previously incorporated U.S. Pat. No. 6,180,956.

The metal chalcogenide semiconducting material containing a nanoentity may be in the form of a thin film, in which the metal chalcogenide semiconducting material is a polycrystalline material, potentially having a grain size equal to or greater than the dimensions between contacts in the semiconductor device. Accordingly, the present disclosure can provide an improved field-effect transistor prepared by the aforementioned method.

Photovoltaic cells might be constructed, incorporating the various methods of this disclosure, by layering the metal-chalcogenide-based nanocomposite with other materials to form a two terminal, sandwich-structure device. For example, one could form an active layer comprised of a p-type metal chalcogenide matrix interspersed with n-type nanowires, thereby resulting in a distributed p-n junction throughout the layer. The metal-chalcogenide-based nanocomposite would be sandwiched between a metal contact, such as Mo or Al, which is supported on a rigid or flexible substrate (e.g. glass, metal, plastic), and a transparent top contact such as doped $TiO_2$, indium tin oxide, fluorine-doped tin oxide or antimony-doped tin oxide.

Alternatively, the cell could be constructed in the reverse order, using a transparent substrate (e.g. glass or plastic)

supporting a transparent conducting contact (such as doped TiO$_2$, indium tin oxide, fluorine-doped tin oxide or antimony-doped tin oxide). The metal-chalcogenide-based nanocomposite would then be deposited on this coated substrate and covered with the back contact (such as Al, Mg, Ca, Ag, Mo or Au). In either case, the metal-chalcogenide-based nanocomposite ("absorber") layer would be deposited by the methods described in this disclosure.

The following non-limiting examples are presented to further illustrate the present disclosure.

Example 1

Nano-Composite Materials Prepared from CdSe Nanocrystals, Nanorods or Nanowires and (N$_2$H$_4$)$_2$ZnTe Soluble ZnTe Precursor Step 1:
The hydrazine-soluble molecular ZnTe precursor (N$_2$H$_4$)$_2$ZnTe is synthesized according to the literature method [Mitzi, D. B.; *Inorg. Chem,;* 2005; 44; 7078].

Figure 1:
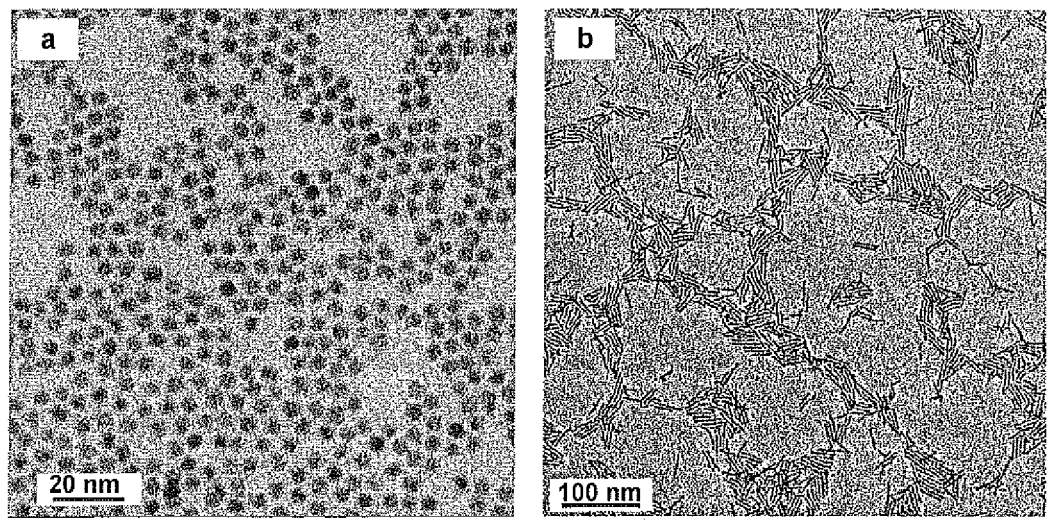
FIGS. 1a and 1b show TEM images of CdSe nanocrystals and CdSe nanorods, respectively.

Step 2:
CdSe nanocrystals capped with hexadecylamine, trioctylphosphine oxide and trioctylphosphine (HDA-TOPO-TOP) ligands are synthesized according to the literature method [Talapin, D. V.; Rogach, A. L.; Kornowski, A.; Haase, M.; Weller, H. *Nano Letters* 2001, 1, 207.]. The nanocrystals are thoroughly washed from the excess of stabilizing ligands by several precipitation/redissolution steps and stored either as a powder or as a solution in hexane. TEM image of CdSe nanocrystals is shown in FIG. 1A.

CdSe nanorods capped with octadecylphosphonic acid, trioctylphosphine oxide and trioctylphosphine ligands are synthesized according to the literature methods [D. V. Talapin, E. V. Shevchenko, C. B. Murray, A. Kornowski, S. Förster and H. Weller. *J. Am. Chem. Soc.* 2004, 126, 12984]. A TEM image of the CdSe nanorods is shown in FIG. 1b.

CdSe nanowires capped with octanoic acid, trioctylphosphine oxide and trioctylphosphine ligands are synthesized by a solution-liquid-solid technique using Bi nanocrystals as catalyst.

Figure 2:
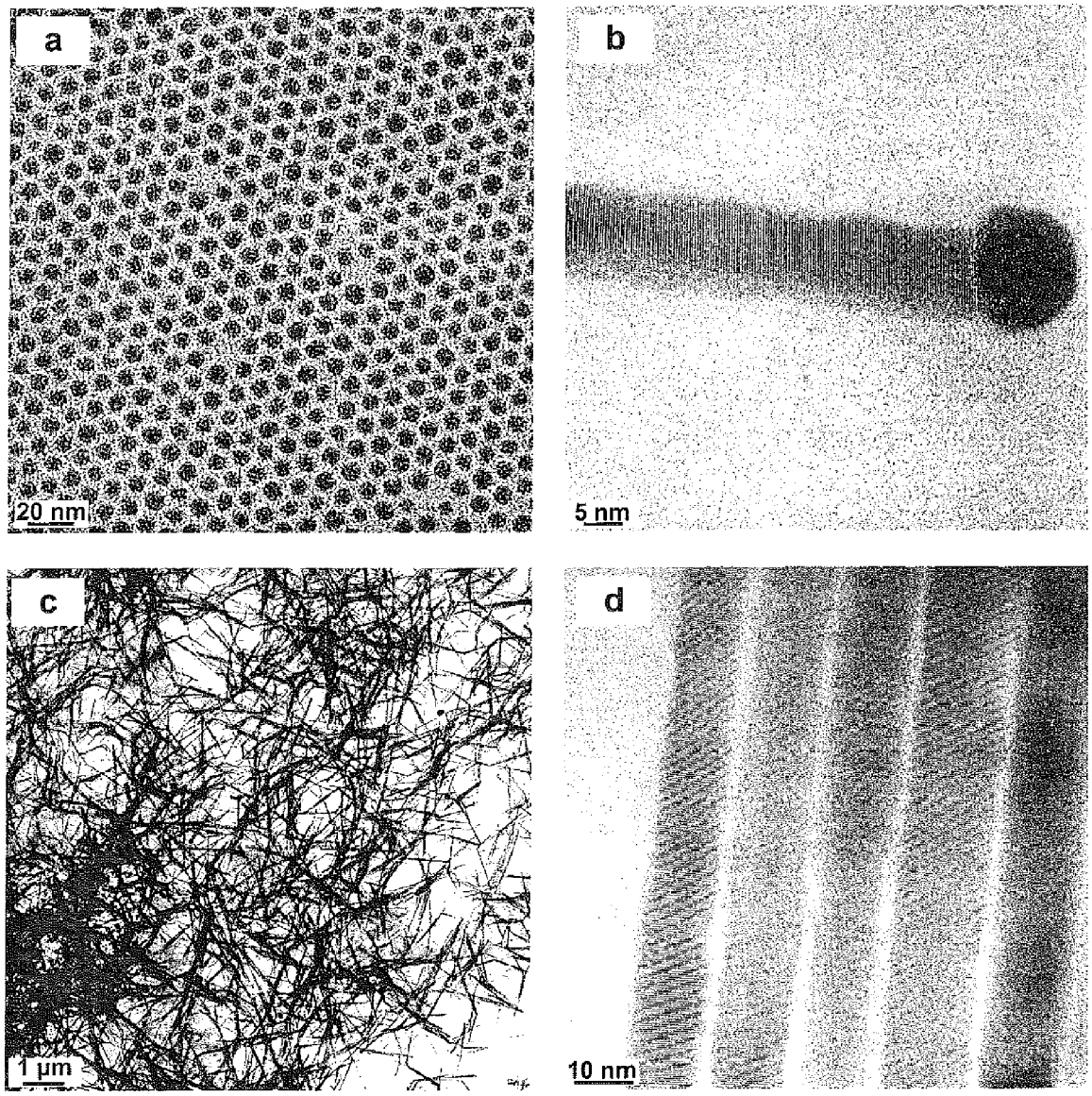
FIG. 2a shows TEM images of Bi nanocrystals used as catalysts for solution-liquid-solid synthesis of CdSe nanowires.
FIGS. 2b, 2c and 2d show TEM images of CdSe nanowires.

Monodisperse Bi nanocrystals capped with hexadecylamine (HDA) are synthesized by a novel high-temperature approach based on decomposition of Bi[N(Si(CH$_3$)$_3$)$_2$]$_3$ in the presence of 1,2-hexadecanediol as a mild reducing agent. In a typical recipe, 3 g HDA and 0.2 g 1,2-hexadecanediol are dissolved in 10 mL dioctyl ether and heated under vacuum to 100° C. for 30 min to degas and dry the reagents. The degassed solution is heated to 210° C. under nitrogen atmosphere and the bismuth stock solution is injected with vigorous stirring. The bismuth stock solution is prepared by dissolving 200 mg Bi[N(Si(CH$_3$)$_3$)$_2$]$_3$ in 1 mL hexane. The color of the reaction mixture turns black after injection of the stock solution due to nucleation of Bi nanocrystals. The solution is kept at 190° C. for 5 min and then cooled rapidly to room temperature. Bi nanocrystals are precipitated from the crude solution by adding an ethanol:hexane mixture (~2:1 vol:vol), isolated by centrifugation and re-dispersed in chloroform. Bi nanocrystals can be precipitated from the chloroform solution by adding methanol and redispersed in a desired solvent (e.g., hexane or octadecene). A typical TEM image of HDA-capped Bi nanocrystals is shown in FIG. 2a.

HDA-stabilized Bi nanocrystals can be used as catalysts for solution-liquid-solid synthesis of II-VI and III-V semiconductor nanowires [(1) Yu, H.; Li, J.; Loomis, R. A.; Gibbons, P. C.; Wang, L.-W.; Buhro, W. E.; *J. Am. Chem. Soc.;* 2003; 125; 16168. (2) Grebinski, J. W.; Hull, K. L.; Zhang, J.; Kosel, T. H.; Kuno, M.; *Chem. Mater.;* 2004; 16; 5260. (3) Fanfair, D. D.; Korgel, B. A.; *Cryst. Growth Des.;* 2005; 5; 1971.]. For the synthesis of CdSe nanowires, a modified method of Grebinski et at (2) is used, optimized for a Bi nanocrystal catalyst. In a typical recipe 3 g TOPO are mixed with 25 mg CdO and 0.23 mL octanoic acid and degassed at 100° C. under vacuum for 30 min. This mixture is heated to 330° C. to dissolve the CdO. The stock solution containing about 2 mg Bi nanocrystals and 25 µmol of trioctylphosphine selenide in 1 mL octadecene is injected at 330° C. under vigorous stirring. The solution is kept at the injection temperature for 3 min and rapidly cooled to the room temperature. Liquid Bi nanodroplets catalyze the growth of CdSe nanowires as shown in FIG. 2b. CdSe nanowires are precipitated from the crude solution by adding n-butanol and re-dispersed in an appropriate solvent like hexane or chloroform. Typical TEM images of CdSe nanowires are shown in FIGS. 2c and 2d.

Step 3
CdSe nanocrystals, nanorods and nanowires do not form stable colloidal dispersions in neat hydrazine. However, all these nanomaterials can be easily dispersed in hydrazine in the presence of 25 mg/mL (N$_2$H$_4$)$_2$ZnTe upon stirring at room temperature under nitrogen atmosphere. Formation of stable colloidal dispersions occurs quickly, usually during the first hour of stirring. The absorption spectrum of about 5 nm CdSe nanocrystals in 25 mg/mL (N$_2$H$_4$)$_2$ZnTe in hydrazine is shown in FIG. 3. The absorption spectrum of CdSe nanocrystals in the presence of (N$_2$H$_4$)$_2$ZnTe shows some deviations from the absorption spectrum of the same nanocrystals in hexane. These changes might be due to partial replacement of Se atoms at the nanocrystal surface with Te atoms from the solution. This process should generate type-II heterostructure nanocrystals with a characteristic long-wavelength tail in the absorption spectrum [Kim, S.; Fisher, B.; Eisler, H.-J.; Bawendi, M.; *J. Am. Chem. Soc.;* 2003; 125; 11466].

Step 4:
Nanocomposite films are spin-coated from hydrazine solutions containing CdSe nanocrystals, nanorods or nanowires and (N$_2$H$_4$)$_2$ZnTe (as described above) on quartz or silicon wafers with a layer of thermally grown SiO$_2$. To improve wetting with hydrazine, the substrates are treated in H$_2$SO$_4$:H$_2$O$_2$ (4:1) solutions for 20 min (followed by a deionized water rinse). Spin-coating is carried out under inert atmosphere. The typical spinning conditions were 1000 or 1500 rpm (30 s) with ramp 1000 rpm/s.

Figure 5:
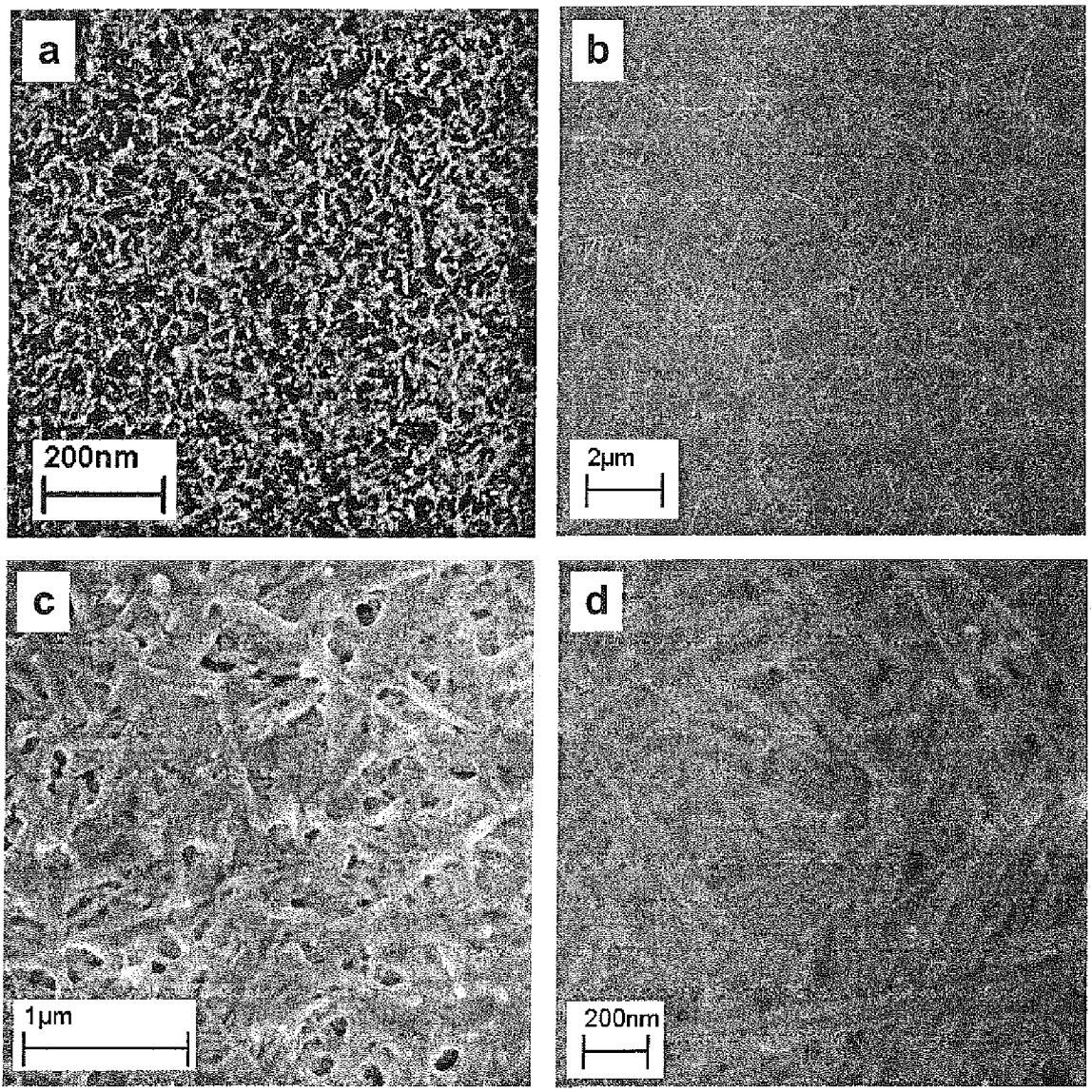
FIGS. 5a-5c show SEM images of (a) nanocomposite prepared from CdSe nanorods and ZnTe precursor annealed at 300° C. for 20 min in nitrogen; (b) nanocomposite prepared from CdSe nanowires in ZnTe precursor (CdSe:ZnTe~1:10 by weight) annealed at 250° C. for 20 min in nitrogen. (c) nanocomposite prepared from CdSe nanowires in the ZnTe matrix (CdSe:ZnTe~1:1 by weight) annealed at 250° C. for 20 min in nitrogen.
FIG. 5d shows a high-resolution image of the nanocomposite shown in (c). The bright spots at the ends of some nanowires are the nanoparticles of Bi catalyst.

Step 5:
Heating of (N$_2$H$_4$)$_2$ZnTe to 250° C. results in the release of hydrazine and the formation of the ZnTe phase with either cubic or hexagonal lattice [Mitzi, D. B.; *Inorg. Chem.;* 2005; 44; 7078.]. Nanocomposite films, prepared as described above and annealed at 250° C. or 300° C. for 20 min in an inert atmosphere, comprise nanocomponents (nanocrystals, nanorods or nanowires) embedded into a crystalline ZnTe matrix. FIGS. 4 and 5 show typical TEM and HRSEM images of CdSe nanorods and nanowires embedded into the crystalline ZnTe matrix.

Figure 6:
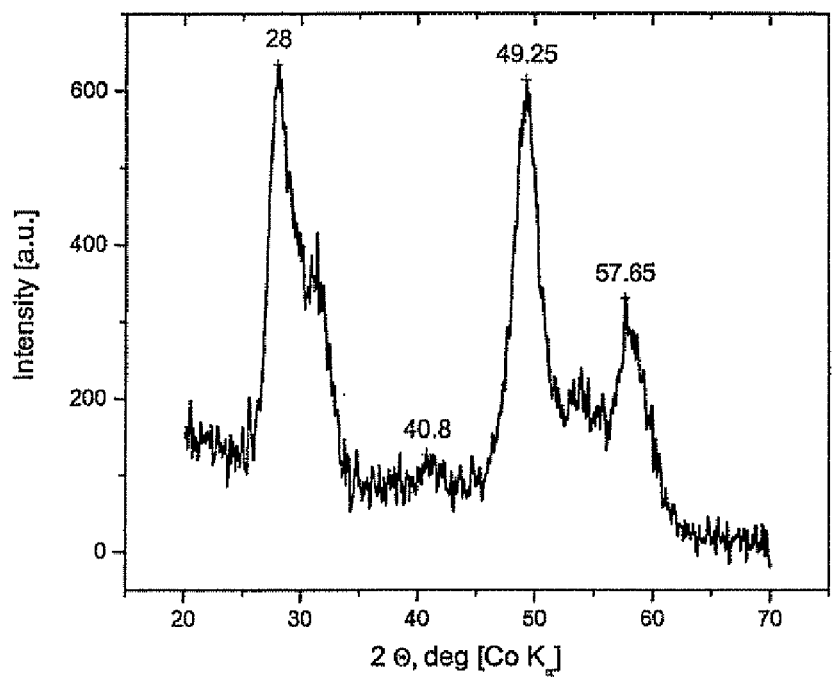
FIG. 6 is a Powder X-ray diffraction pattern ($CoK_\alpha$ radiation, 1.789 Å) of the nanocomposite prepared from CdSe nanorods and ZnTe matrix annealed at 300° C. for 20 min.

The powder X-ray diffraction pattern of CdSe nanorods in a ZnTe matrix annealed at 300° C. for 20 min is shown in FIG. 6. The peaks in the diffraction pattern correspond to the hexagonal (wurtzite) phase of CdSe and ZnTe. It is difficult to deconvolute reflections from the CdSe and ZnTe phases because of the small difference in the lattice parameters of CdSe and ZnTe and the broadened diffraction reflections characteristic to nanometer scale crystallites.

Electrical Characterization:

FIG. 7a shows $I_D$-$V_{DS}$ scans measured at different gate voltages for a film of CdSe nanowires in a ZnTe matrix (CdSe:ZnTe ~1:10 by weight) annealed at 250° C. for 20 min in nitrogen. FIG. 7b shows the dependence of the drain current $I_d$ on the gate voltage $V_G$ at fixed source-drain bias. The observed n-type gate effect shows that most of current in the CdSe nanowire/ZnTe nanocomposite is carried through the n-type CdSe nanowires rather than through p-type ZnTe matrix.

Example 2

A Composite Material Prepared from CdSe Nanocrystals and $(N_2H_5)_2(N_2H_4)_2In_2Se_4$ Soluble $In_2Se_3$ Precursor Step 1:

A 0.25M solution of $(N_2H_5)_2(N_2H_4)_2In_2Se_4$ in hydrazine is prepared by dissolving 1 mmol $In_2Se_3$ in 4 mL hydrazine in the presence of 1 mmol selenium at room temperature [D. B. Mitzi, M. Copel, S. J. Chey, Adv. Mater., 17, 1285 (2005)]. The colorless solution is filtered through a 0.2 μm PTFE filter and stored under nitrogen.

Step 2:

CdSe nanocrystals capped with trioctylphosphine oxide and trioctylphosphine (TOPO-TOP) ligands are synthesized according to the literature method [C. B. Murray, D. J. Norris, M. G. Bawendi; J. Am. Chem. Soc.; 1993; 115; 8706.]. The nanocrystals are thoroughly washed from the excess of stabilizing ligands by several precipitation and redissolution steps and stored either as a powder or as a solution in hexane.

Step 3:

The CdSe nanocrystals are easily dispersed in the hydrazine solution of $(N_2H_5)_2N_2H_4)_2n_2Se_4$, forming a stable colloidal solution. The color of the solution is determined by the absorption spectrum of CdSe nanocrystals and varied from yellow for ~3 nm CdSe nanocrystals to dark brown for larger ~5 nm CdSe nanocrystals (FIG. 8).

The absorption spectra of CdSe nanocrystals dispersed in hexane and in a solution of $(N_2H_5)_2N_2H_4)_2In_2Se_4$ in hydrazine are compared in FIG. 9. The peaks in the absorption spectra of the hydrazine solutions coincide well with the excitonic absorption features of corresponding quantum-confined CdSe nanocrystals. This demonstrates that CdSe nanocrystals disperse in the hydrazine solution of $(N_2H_5)_2(N_2H_4)_2In_2Se_4$ without any changes in their size, shape and electronic structure.

Step 4:

Field-effect devices comprising nanocomposite film of CdSe nanocrystals in $In_2Se_3$ matrix are fabricated by spin-coating the solutions of ~5 nm CdSe nanocrystals in hydrazine containing 0.05M $(N_2H_5)_2(N_2H_4)_2In_2Se_4$ at 1000-1500 rpm on highly-doped silicon wafers with a 100 nm thick thermal silicon oxide gate dielectric. Bottom Ti/Au electrodes are patterned on the silicon oxide by photolithography.

Step 5:

The films are annealed at 350° C. for 20 min in a nitrogen atmosphere.

Electronic Properties of CdSe Nanocrystals in $In_2Se_3$ Matrix.

FIG. 10 shows $I_D$-$V_{DS}$ scans for different gate voltages $V_G$ for a typical device. The gate voltage changed from 0 to 60V in steps of 20V.

FIG. 11 shows the dependence of drain current $I_d$ on the gate voltage $V_G$ at fixed source-drain bias. There is pronounced hysteresis in the gate scans and characteristic and reproducible switching effects. Similar behavior can be observed for close-packed arrays of hydrazine-treated CdSe nanocrystals.

Memory Effect:

Hysteresis in the gate voltage scans can be employed in a novel type of solution-processed memory device. Conductance of the nanocomposite CdSe/$In_2Se_3$ film depends on the history of voltage applied to the gate electrode. FIG. 12 shows the low-bias parts of the $I_D$-$V_{DS}$ curves recorded ~2 min after positive and negative pulses of gate voltage for the same device. Depending on the polarity of previously applied pulse of gate voltage, the low-field conductance of the CdSe nanocrystals/$In_2Se_3$ film varies by more than an order of magnitude, thus allowing "on" and "off" states of a nanocomposite-based memory cell.

Optoelectronic Effect:

Current through the film of CdSe nanocrystals in an $In_2Se_3$ matrix can be modulated by light (FIG. 13), thus demonstrating applicability of solution-processed inorganic nanocomposites in photodetectors and photovoltaic cells.

Example 3

A Composite Material Prepared from PbSe Nanowires and $(N_2H_4)_2ZnTe$ Soluble ZnTe precursor Step 1:

The hydrazine-soluble molecular ZnTe precursor $(N_2H_4)_2$ZnTe is synthesized according to the literature method [Mitzi, D. B.; Inorg. Chem.; 2005; 44; 7078.].

Figure 14:
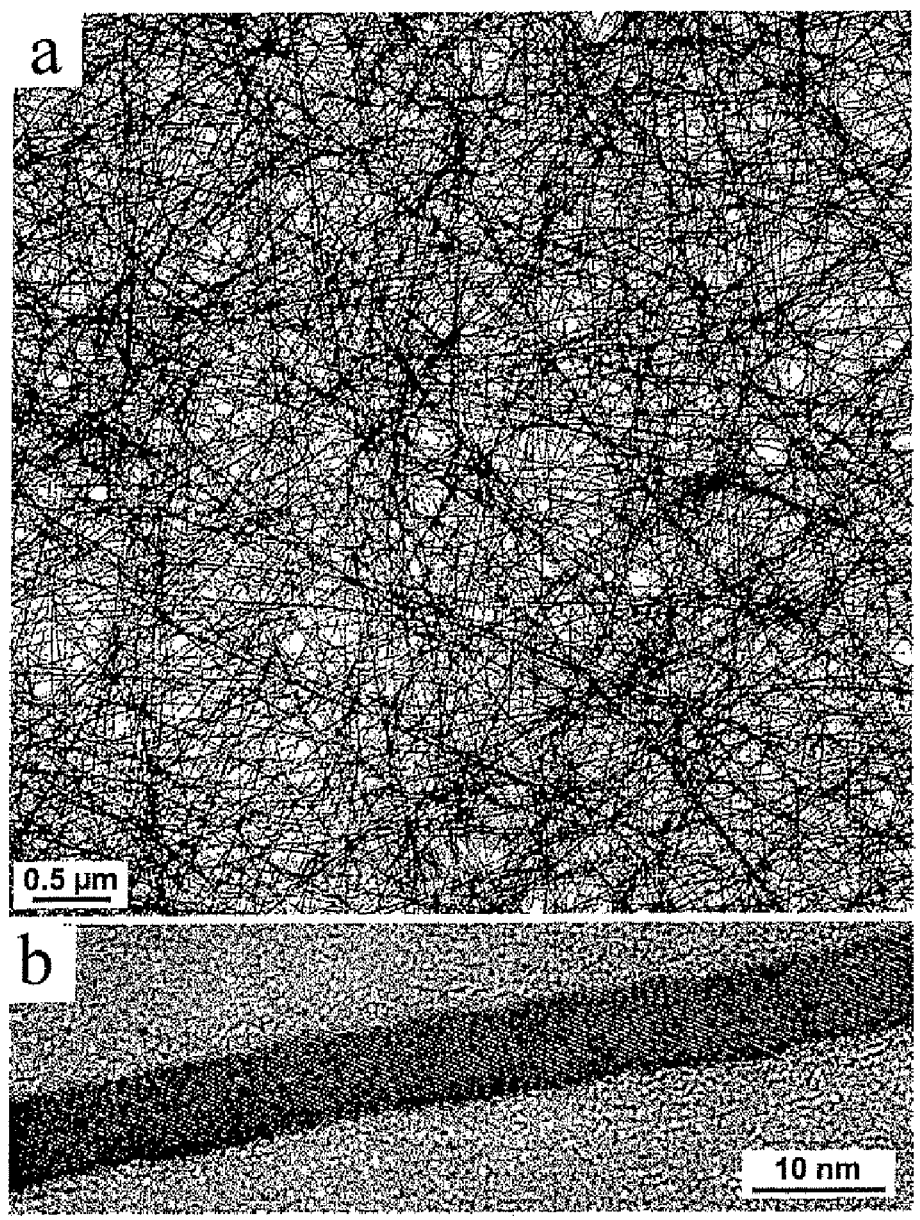

Step 2:

PbSe nanowires capped with n-tetradecylphosphonic and oleic acids are synthesized as described in YOR9-2004-0429US2. The typical TEM and HRTEM images are shown in FIG. 14.

Step 3:

PbSe nanowires can be dispersed in hydrazine in the presence of 25 mg/mL $(N_2H_4)_2$ZnTe, forming a stable colloidal solution after several days of stirring at room temperature under nitrogen atmosphere.

Step 4:

Nanocomposite precursor films are spin-coated from a hydrazine solution containing PbSe nanowires and $(N_2H_4)_2$ZnTe (as described for Example 1). FIG. 15a shows a TEM image of the film consisting of PbSe nanowires embedded into a matrix of $(N_2H_4)_2$ZnTe.

Step 5:

Annealing at 250° C. for 20 min converts $(N_2H_4)_2$ZnTe into ZnTe. Annealed PbSe/ZnTe composite materials consist of crystalline nanowires and nanorods with diameters much larger than the diameters of initial PbSe nanowires (FIGS. 15b, 15c).

Examples of some other specific systems pursuant of this disclosure are:

Nano-Composite Materials Fabricated from Mixtures of $(N_2H_4)_2$ZnTe with:

CdTe nanocrystals capped with octadecylphosphonic acid, trioctylphosphine oxide and triocetylphosphine.

PbSe nanocrystals capped with oleic acid and trioctylphosphine.

PbTe nanocrystals capped with oleic acid and trioctylphosphine

Nano-Composite Materials Fabricated from Mixtures of $(N_2H_4)_2(N_2H_5)_2In_2Se_4$ with:

CdTe nanocrystals capped with octadecylphosphonic acid, trioctylphosphine oxide and trioctylphosphine PbTe nanocrystals capped with oleic acid and trioctylphosphine.

FePt nanocrystals capped with oleic acid and oleyl amine

The foregoing description illustrates and describes the disclosure. Additionally, the disclosure shows and describes only the preferred embodiments but, as mentioned above, it is to be understood that it is capable to use in various other combinations, modifications, and environments and is capable of changes or modifications within the scope of the invention concepts as expressed herein, commensurate with the above teachings and/or the skill or knowledge of the relevant art. The embodiments described herein above are further intended to explain best modes known by applicant and to enable others skilled in the art to utilize the disclosure in such, or other, embodiments and with the various modifications required by the particular applications or uses thereof. Accordingly, the description is not intended to limit the invention to the form disclosed herein. Also, it is intended to the appended claims be construed to include alternative embodiments.

All publications and patent applications cited in this specification are herein incorporated by reference, and for any and all purposes, as if each individual publication or patent application were specifically and individually indicated to be incorporated by reference.

What is claimed is:

1. A film prepared by method for fabricating an inorganic nanocomposite which comprises:
   obtaining a solution of a soluble hydrazine-based metal chalcogenide precursor;
   dispersing a nanoentity in the solution of the metal chalcogenide precursor;
   applying a solution of said precursor containing said nanoentity onto a substrate to produce a film of said precursor and said nanoentity; and
   annealing the film of the precursor to produce the metal chalcogenide nanocomposite film comprising at least one metal chalcogenide and at least one nanoentity on the substrate.

2. A multilayer film obtained by the repeated use of a method for fabricating an inorganic nanocomposite which comprises:
   obtaining a solution of a soluble hydrazine-based metal chalcogenide precursor;
   dispersing a nanoentity in the solution of the metal chalcogenide precursor;
   applying a solution of said precursor containing said nanoentity onto a substrate to produce a film of said precursor and said nanoentity; and
   annealing the film of the precursor to produce the metal chalcogenide nanocomposite film comprising at least one metal chalcogenide and at least one nanoentity on the substrate.

3. A field-effect transistor of the type having a source region and a drain region, a channel layer extending between the source region and the drain region, the channel layer including a semiconducting material, a gate region, disposed in spaced adjacency to the channel layer, an electrically insulating layer between the gate region and the source region, drain region and channel layer, obtained by a method comprising:
   preparing a channel layer comprising a semiconducting film of a metal chalcogenide and nanoentity composite by obtaining a solution of a soluble hydrazine-based metal chalcogenide precursor;
   dispersing a nanoentity in the solution the metal chalcogenide precursor;
   applying a solution of said precursor containing said nanoentity onto a substrate to produce a film of said precursor and said nanoentity; and
   annealing the film of the precursor to produce the metal chalcogenide nanocomposite film comprising at least one metal chalcogenide and at least one nanoentity.

4. The film of claim 1 wherein said nanoentity is selected from the group consisting of nanoparticles, nanorods, nano-tetrapods and nanowires.

5. The film of claim 1 wherein the metal chalcogenide comprises GeS, $GeSe_2$, $SnS_2$, $SnSe_2$, $Sb_2S_3$, $Sb_2Se_3$, $Sb_2Te_3$, $In_2Se_3$, $In_2Te_3$, $Cu_2S$, HgSe, ZnTe and mixtures thereof.

6. The film of claim 1 which comprises obtaining said solution of a soluble hydrazine-based metal chalcogenide precursor in hydrazine.

7. The film of claim 1 wherein the nanoentity is selected from the group consisting of CdS, CdSe, PbSe, CdTe, PbS, PbSe, PbTe, ZnS, ZnSe, $Bi_2S_3$, $Bi_2Se_3$, $Bi_2Te_3$, HgS, HgSe, HgTe, InP, InAs, and Co, Fe, FePt, and core/shell CdSe/ZnS, CdSe/CdS, InP/CdSe, InP/ZnS, InP/ZnSe, InAs/CdSe, InAs/ZnSe and combinations thereof.

8. The film of claim 1 wherein the nanoentity is selected from the group consisting of CdSe, PbSe, CdTe, PbTe and FePt.

9. The film of claim 1 wherein the annealing is carried out at a temperature of about 100° C. to about 350° C. for about 1 to about 60 minutes.

10. The film of claim 1 wherein the solution is applied by spin coating, drop-casting, stamping or printing.

11. The film of claim 1 wherein the solution is applied by spin coating.

12. The film of claim 1 wherein the annealing is carried out by placing the film on a hot plate, in an oven or by laser-based annealing.

13. The film of claim 1, wherein said substrate is selected from the group consisting of:
   kapton, silicon, amorphous hydrogenated silicon, silicon carbide (SiC), silicon dioxide ($SiO_2$), quartz, sapphire, glass, metal, diamond-like carbon, hydrogenated diamond-like carbon, gallium nitride, gallium arsenide, germanium, silicon-germanium, indium tin oxide, boron carbide, boron nitride, silicon nitride ($Si_3N_4$), alumina ($Al_2O_3$), cerium (IV) oxide ($CeO_2$), tin oxide ($SnO_2$), titania ($TiO_2$), $Ta_2O_5$, $ZrO_2$, $HfO_2$, zinc titanate ($ZnTiO_2$), lead zirconate titanate (PZT), a plastic material and a combination thereof.

14. The multilayer film of claim 2 wherein said nanoentity is selected from the group consisting of nanoparticles, nanorods, nano-tetrapods and nanowires.

15. The multilayer film of claim 2 wherein the metal chalcogenide comprises GeS, $GeSe_2$, $SnS_2$, $SnSe_2$, $Sb_2S_3$, $Sb_2Se_3$, $Sb_2Te_3$, $In_2Se_3$, $In_2Te_3$, $Cu_2S$, HgSe, ZnTe and mixtures thereof.

16. The multilayer film of claim 2 which comprises obtaining said solution of a soluble hydrazine-based metal chalcogenide precursor in hydrazine.

17. The multilayer film of claim 2 wherein the nanoentity is selected from the group consisting of CdS, CdSe, PbSe, CdTe, PbS, PbSe, PbTe, ZnS, ZnSe, $Bi_2S_3$, $Bi_2Se_3$, $Bi_2Te_3$, HgS, HgSe, HgTe, InP, InAs, and Co, Fe, FePt, and core/shell CdSe/ZnS, CdSe/CdS, InP/CdSe, InP/ZnS, InP/ZnSe, InAs/CdSe, InAs/ZnSe and combinations thereof.

18. The multilayer film of claim 2 wherein the nanoentity is selected from the group consisting of CdSe, PbSe, CdTe, PbTe and FePt.

19. The multilayer film of claim 2 wherein the annealing is carried out at a temperature of about 100° C. to about 350° C. for about 1 to about 60 minutes.

20. The multilayer film of claim 2 wherein the solution is applied by spin coating, drop-casting, stamping or printing.

21. The multilayer film of claim 2 wherein the solution is applied by spin coating.

22. The multilayer film of claim 2 wherein the annealing is carried out by placing the film on a hot plate, in an oven or by laser-based annealing.

23. The multilayer film of claim 2, wherein said substrate is selected from the group consisting of: kapton, silicon, amorphous hydrogenated silicon, silicon carbide (SiC), silicon dioxide ($SiO_2$), quartz, sapphire, glass, metal, diamond-like carbon, hydrogenated diamond-like carbon, gallium nitride, gallium arsenide, germanium, silicon-germanium, indium tin oxide, boron carbide, boron nitride, silicon nitride ($Si_3N_4$), alumina ($Al_2O_3$), cerium (IV) oxide ($CeO_2$), tin oxide ($SnO_2$), titania ($TiO_2$), $Ta_2O_5$, $ZrO_2$, $HfO_2$, zinc titanate ($ZnTiO_2$), lead zirconate titanate (PZT), a plastic material and a combination thereof.

* * * * *